US012444659B2

United States Patent
Kojima

(10) Patent No.: US 12,444,659 B2
(45) Date of Patent: Oct. 14, 2025

(54) SEMICONDUCTOR DEVICE WITH TEST PATTERN STRUCTURES

(71) Applicant: MICRON TECHNOLOGY, INC., Boise, ID (US)

(72) Inventor: Nozomi Kojima, Shiga (JP)

(73) Assignee: Micron Technology, Inc., Boise, ID (US)

(*) Notice: Subject to any disclaimer, the term of this patent is extended or adjusted under 35 U.S.C. 154(b) by 659 days.

(21) Appl. No.: 17/585,405

(22) Filed: Jan. 26, 2022

(65) Prior Publication Data

US 2023/0238292 A1 Jul. 27, 2023

(51) Int. Cl.
H01L 21/66 (2006.01)
H01L 21/311 (2006.01)
H01L 21/768 (2006.01)
H01L 23/528 (2006.01)

(52) U.S. Cl.
CPC ........ *H01L 22/32* (2013.01); *H01L 21/31116* (2013.01); *H01L 21/76802* (2013.01); *H01L 21/76877* (2013.01); *H01L 23/528* (2013.01)

(58) Field of Classification Search
CPC .................................................. H01L 22/32
See application file for complete search history.

(56) References Cited

U.S. PATENT DOCUMENTS

| | | | | |
|---|---|---|---|---|
| 2003/0136762 A1* | 7/2003 | Zhao | ........................ | H01L 22/34 257/E21.527 |
| 2004/0168908 A1* | 9/2004 | Friedemann | ........ | H01L 21/2855 438/785 |
| 2005/0026310 A1* | 2/2005 | Zhao | ........................ | H01L 22/34 257/E21.527 |
| 2005/0116338 A1* | 6/2005 | Hirai | ........................ | H01L 22/32 257/734 |
| 2006/0234496 A1* | 10/2006 | Zhao | ........................ | H01L 22/26 257/E21.528 |
| 2010/0044858 A1* | 2/2010 | Cohn | ................ | H01L 21/76838 257/E23.179 |
| 2012/0106117 A1* | 5/2012 | Sundaram | ............... | H01L 25/18 257/772 |
| 2018/0156862 A1* | 6/2018 | Chen | ................... | G01R 31/2884 |
| 2023/0056623 A1* | 2/2023 | Liu | ........................ | H01L 24/03 |
| 2023/0387000 A1* | 11/2023 | Chen | ................... | H01L 23/5283 |

FOREIGN PATENT DOCUMENTS

| | | | | |
|---|---|---|---|---|
| CN | 104347479 A | * | 2/2015 | ....... H01L 21/76831 |
| JP | 2009186869 A | | 8/2009 | |
| KR | 20040057506 A | * | 7/2004 | |

* cited by examiner

*Primary Examiner* — Peter Bradford
(74) *Attorney, Agent, or Firm* — Dorsey & Whitney LLP

(57) ABSTRACT

Apparatuses and methods with controlled resist poisoning in manufacturing semiconductor devices are described. An example apparatus includes a first structure and a second structure. The first structure includes a first conductive component and a second conductive component adjacent to one another. The second structure includes a third conductive component and a fourth conductive component adjacent to one another. The third and fourth conductive components correspond to the first and second conductive components respectively. A first distance between the first conductive component and the second conductive component is different from a second distance between the third conductive component and the fourth conductive component.

13 Claims, 7 Drawing Sheets

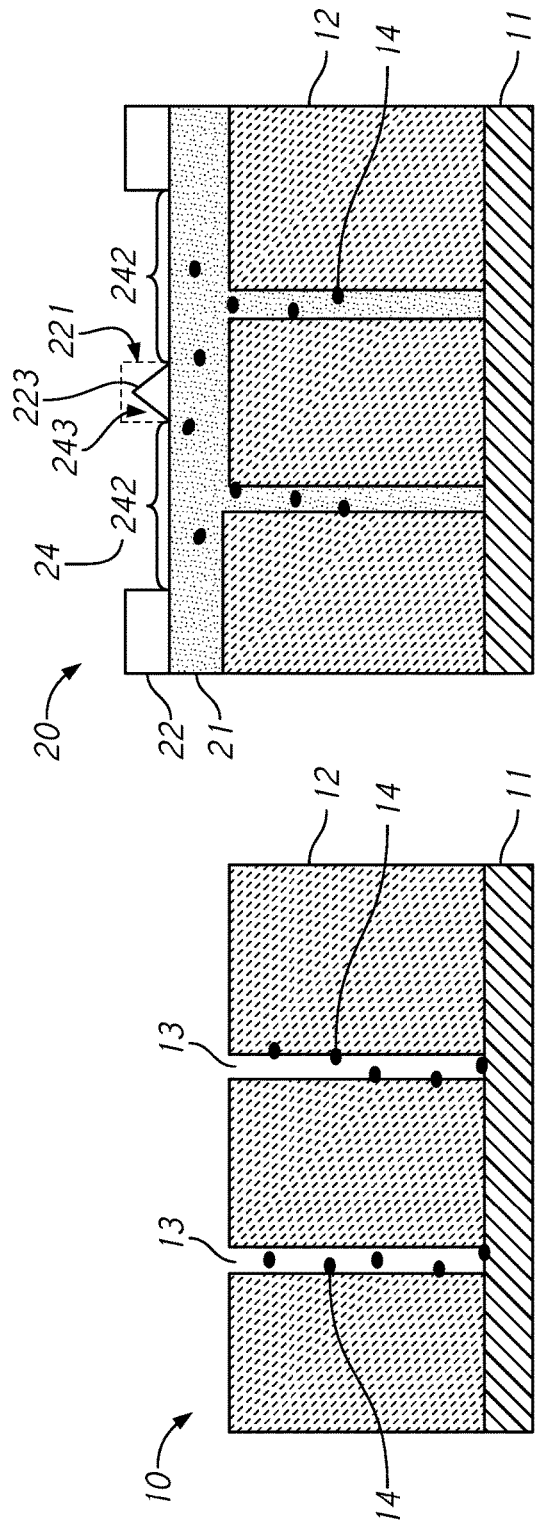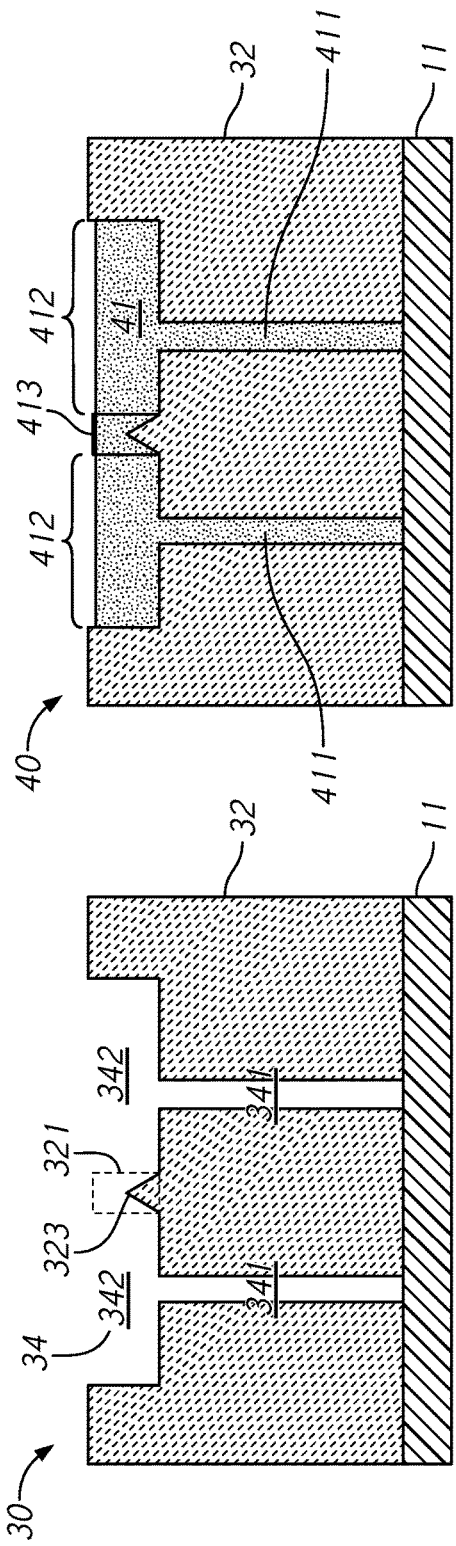

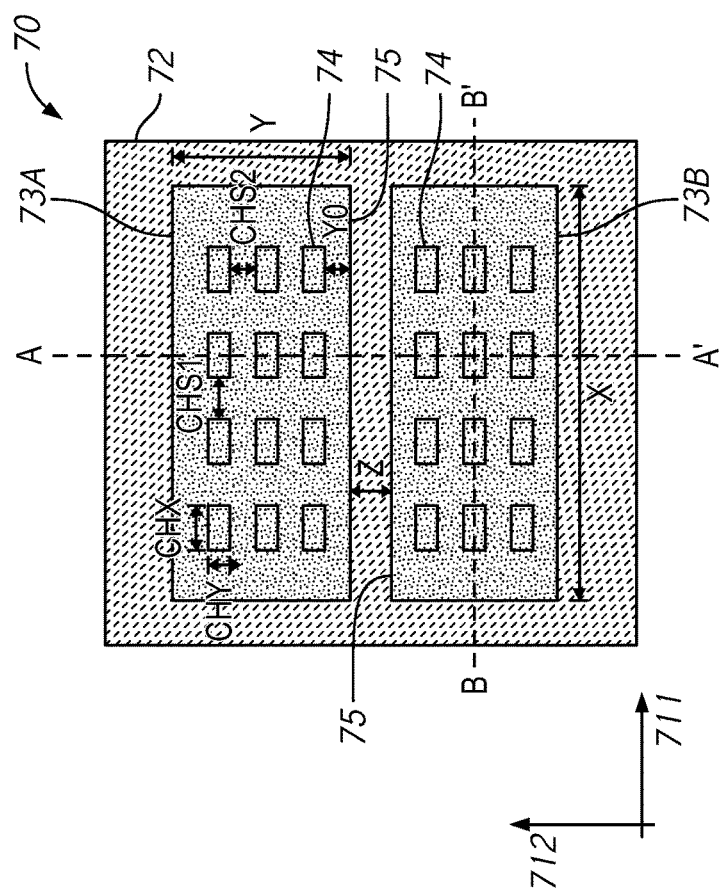
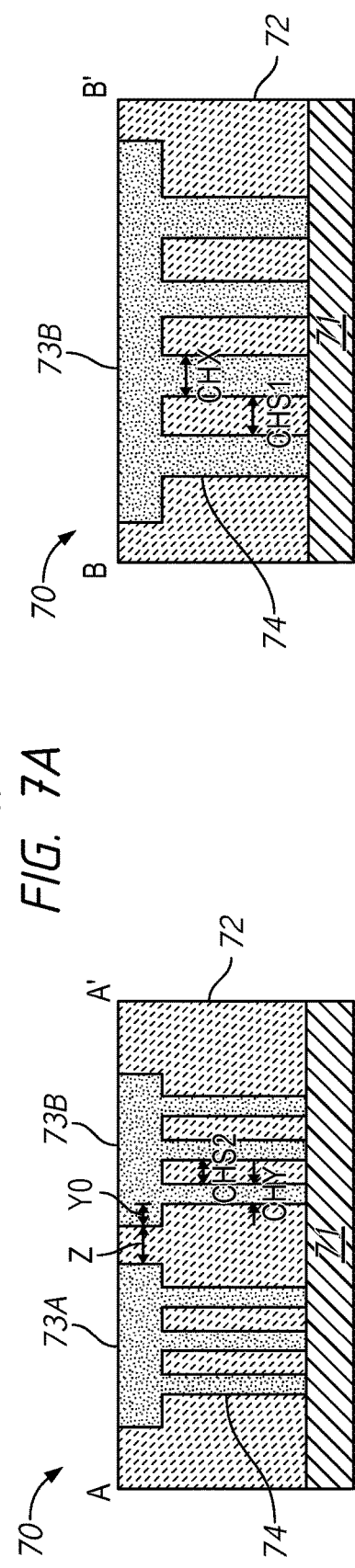
FIG. 7A
FIG. 7B
FIG. 7C

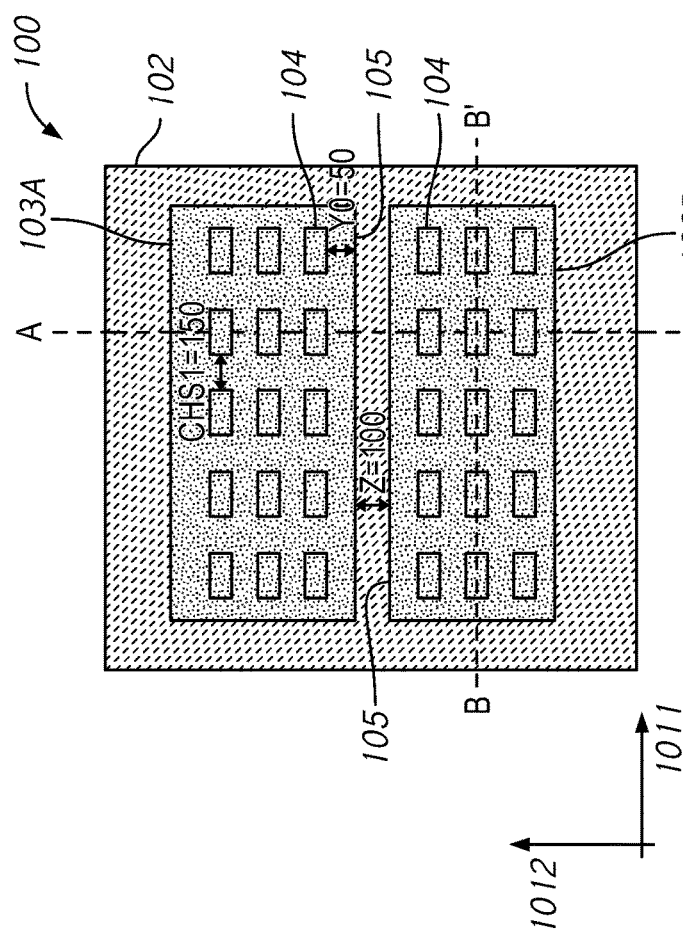
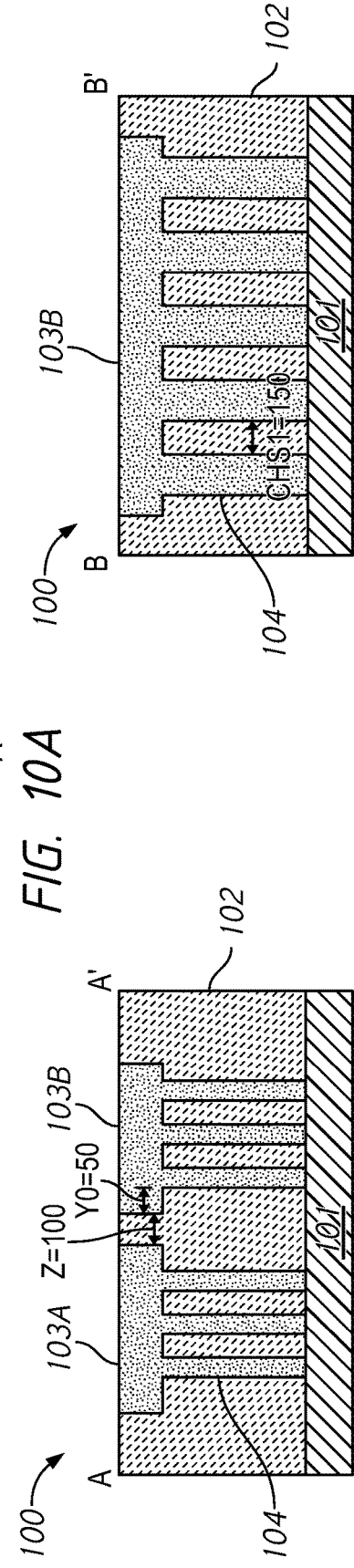
FIG. 10A
FIG. 10B
FIG. 10C

SEMICONDUCTOR DEVICE WITH TEST PATTERN STRUCTURES

BACKGROUND

High data reliability, high speed memory access, lower power consumption and reduced chip size are features that are demanded from semiconductor devices. To achieve reduced chip size and high data reliability, accurate fabrication of the semiconductor devices has been desired. To form an interconnect including contacts and wirings, a dual-Damascene process has been employed. In the dual-Damascene process, multiple layers of openings corresponding to the contacts and the wirings are formed in one or more dielectric layers. A diffusion barrier layer and a seed layer of a conductive material (e.g., copper (Cu)) are deposited by a physical vapor deposition (PVD) method, such as sputtering to coat inside the openings. The conductive material is further deposited by electroplating to fill the openings. After filling the openings with the conductive material, excess conductive material is removed by planarization, such as chemical-mechanical polishing (CMP). Thus, the interconnect including the contacts and the wirings is formed.

FIG. 1 is a vertical cross-sectional view of a structure 10 in a semiconductor device. The structure 10 is an intermediate structure that is used to fabricate a multi-layer structure of the semiconductor device using the dual-Damascene process. The structure 10 includes a dielectric base layer 11 and a dielectric layer 12. For example, the dielectric base layer 11 includes silicon nitride (Si3N4) and the dielectric layer 12 includes silicon dioxide (SiO2) or silicon oxycarbide (SiOC). The dielectric layer 12 is patterned with openings 13 that correspond to contacts using photopatterning and dry etching. Bottoms of the openings 13 may expose a top surface of the dielectric base layer 11. Particles or ions of a basic substance 14 containing nitrogen, such as amines, from the dielectric base layer 11 pass through surfaces of the dielectric layer 12 in the openings 13.

FIG. 2 is a vertical cross-sectional view of a structure 20 in the semiconductor device. The structure 20 may be an intermediate structure that is used to fabricate the multi-layer structure of the semiconductor device using the dual-Damascene process. The structure 20 may be fabricated by performing one or more fabrication processes on the structure 10 of FIG. 1. An anti-reflective coating 21, such as a bottom layer anti-reflective coating (BARC) is formed on a top surface and side surfaces inside the openings 13 of the dielectric layer 12 and a top surface of the dielectric base layer 11 at the bottom of the openings. The anti-reflective coating 21 minimizes intensity of light reflected from the coated surfaces. A photoresist 22 is deposited on the anti-reflective coating 21. The photoresist 22 is patterned with openings 242 that correspond to patterns of wirings to be reflected on the dielectric layer 12. The photoresist 22 should include a portion 221 between the openings 242 so that wirings formed in the openings are separated. However, the particles or ions of the basic substance 14 that pass through the anti-reflective coating 21 cause resist poisoning. The particles or ions of the basic substance 14 neutralize photo-generated acid of the photoresist 22, resulting in undeveloped or underdeveloped resist in some areas after photolithographic imaging. For example, the portion 221 may be underdeveloped and result in the formation of defective resist portion 223 between the openings 242.

FIG. 3 is a vertical cross-sectional view of a structure 30 in the semiconductor device. The structure 30 may be an intermediate structure that is used to fabricate the multi-layer structure of the semiconductor device using the dual-Damascene process. The structure 30 may be fabricated by performing one or more fabrication processes on the structure 20 of FIG. 2. By photopatterning and dry etching the dielectric layer 12, a dielectric layer 32 including an opening 34 is formed. The opening 34 includes portions 341 and portions 342. The portions 341 include lower portions of the openings 13 and the portions 342 include upper portions of the openings 13. Because the portion 221 was underdeveloped resulting in defective resist portion 223, surfaces of a portion 321 of a dielectric layer 32 that should separate the portions 342 are overetched and corners of the portion 321 between the surfaces are reduced. Thus, a portion 323 of the dielectric layer 32 has a lower height than the portion 321, which results in portions 342 being connected.

FIG. 4 is a vertical cross-sectional view of a structure 40 in the semiconductor device. The structure 40 may be an intermediate structure that is used to fabricate the multi-layer structure of the semiconductor device using the dual-Damascene process. The structure 40 may be fabricated by performing one or more fabrication processes on the structure 30 of FIG. 3. A diffusion barrier layer and a seed layer of a conductive material (e.g., copper (Cu)) are deposited to coat inside the opening 34. A conductive material 41 is deposited by electroplating to fill the opening 34. The conductive material 41 includes contacts 411 in the portions 341 of the opening 34 and wirings 412 in the portions 342 of the opening 34. However, because of surfaces of the portion 321 are overetched, the wirings 412 in the conductive material 41 that should be separated are connected by a portion 413 of the conductive material 41. Thus, the wirings 412 are short circuited. To avoid such short circuits, appropriate circuit patterns to ensure separation between independent adjacent interconnects, such as wirings, are desired.

BRIEF DESCRIPTION OF THE DRAWINGS

FIG. 1 is a vertical cross-sectional view of a structure in a semiconductor device.

FIG. 2 is a vertical cross-sectional view of a structure in the semiconductor device.

FIG. 3 is a vertical cross-sectional view of a structure in the semiconductor device.

FIG. 4 is a vertical cross-sectional view of a structure in the semiconductor device.

FIG. 7A is a schematic diagram for a test structure of a structure in a semiconductor device in accordance with an embodiment of the present disclosure.

FIGS. 7B and 7C are vertical cross-sectional views of the structure of FIG. 7A in the semiconductor device in accordance with the embodiment of the present disclosure.

FIG. 10A is a schematic diagram for a test structure of a structure in a semiconductor device in accordance with an embodiment of the present disclosure.

FIGS. 10B and 10C are vertical cross-sectional views of the structure of FIG. 10A in the semiconductor device in accordance with the embodiment of the present disclosure.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 5:
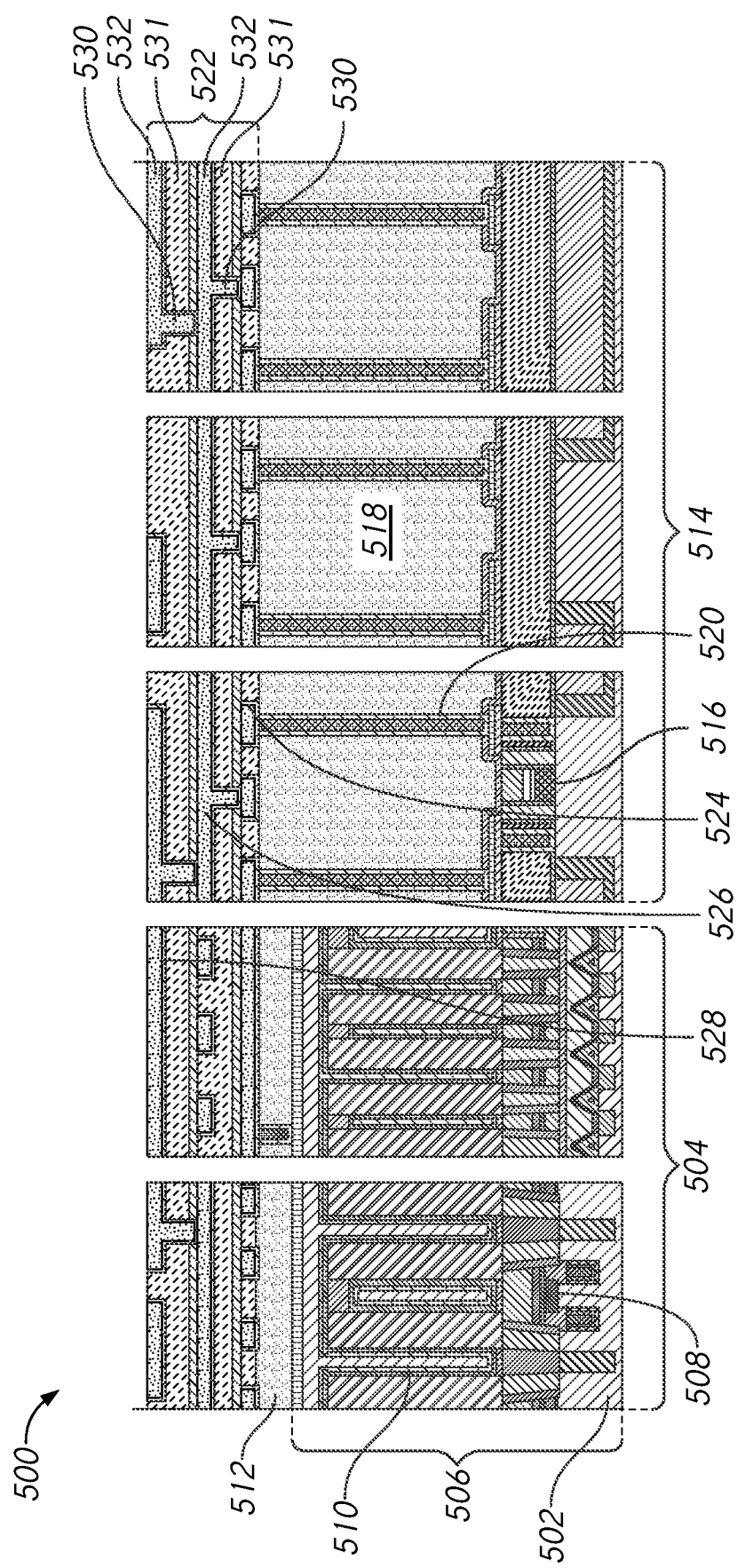
FIG. 5 is a vertical cross-sectional view of a structure in a semiconductor device in accordance with an embodiment of the present disclosure.

FIG. 5 is a vertical cross-sectional view of a structure of a memory device 500 including a memory cell region 504 and a peripheral region 514 in accordance with one embodiment of the present disclosure. The following description uses a dynamic random-access memory (DRAM) as an illustrative example of the memory device 500. The memory device 500 includes a portion fabricated in a front-end-of-line (FEOL) above a substrate 502. The portion fabricated in the FEOL includes memory cells 506 in the memory cell region 504. The memory cells 506 are disposed on the substrate 502. Each of the memory cells 506 includes a transistor 508 and a capacitor 510 coupled to the transistor 508. In some embodiments, the transistor 508 is disposed on the substrate 502, and the capacitor 510 is disposed above the transistor 508. A dielectric layer 512 may be disposed above the capacitor 510. In the peripheral region 514, the portion fabricated in the FEOL includes a transistor 516 that may be disposed on the substrate 502. A dielectric layer 518 may be disposed above the substrate 502 in the peripheral region 514. The dielectric layer 518 may be disposed above the transistor 516. A via 520 coupled to the transistor 516 may be disposed within the dielectric layer 518. In some embodiments, the dielectric layers 512 and 518 may include one or more insulating materials. For example, the one or more insulating materials may include silicon nitride (Si3N4).

The memory device 500 includes a portion 522 fabricated in a back-end-of-line (BEOL) above the portion fabricated in the FEOL. The portion 522 includes one or more dielectric layers 531 above the dielectric layers 512 and 518 in the FEOL. The portion 522 may also include interconnects 524, 526 and 528 disposed above the dielectric layers 512 and 518. While the portion 522 in FIG. 5 includes the interconnects 524, 526 and 528, a number of interconnects may not be limited to three. In some embodiments, the interconnect 524 may be disposed on the dielectric layers 512 and 518. The interconnect 526 may be disposed on the interconnect 524. The interconnect 528 may be disposed on the interconnect 528. In some embodiments, some interconnects in the portion 522 may include one or more contacts 530 and one or more wirings 532. In some embodiments, the one or more dielectric layers of the portion 522 may be disposed between the wirings 532 in the portion 522. Each of the one or more contacts 530 may be disposed in one of the one or more dielectric layers 531. Each of the one or more wirings 532 may be disposed on one of the one or more dielectric layers 531.

In some embodiments, the one or more dielectric layers 531 include one or more insulating materials. For example, the one or more insulating materials may include silicon dioxide (SiO2) or silicon oxycarbide (SiOC). The interconnects 524, 526 and 528 are conductive layers. In some embodiments, the interconnects 524, 526 and 528 may be a first metal layer (M1), a second metal layer (M2), and a third metal layer (M3) including metal, respectively. For example, the interconnects 524, 526 and 528 may include copper (Cu). Each of the interconnects 524, 526 and 528 may be formed using the dual-Damascene process. The contacts 530 and the wirings 532 above the contacts 530 may be formed simultaneously in the dual-Damascene process.

Figure 6:
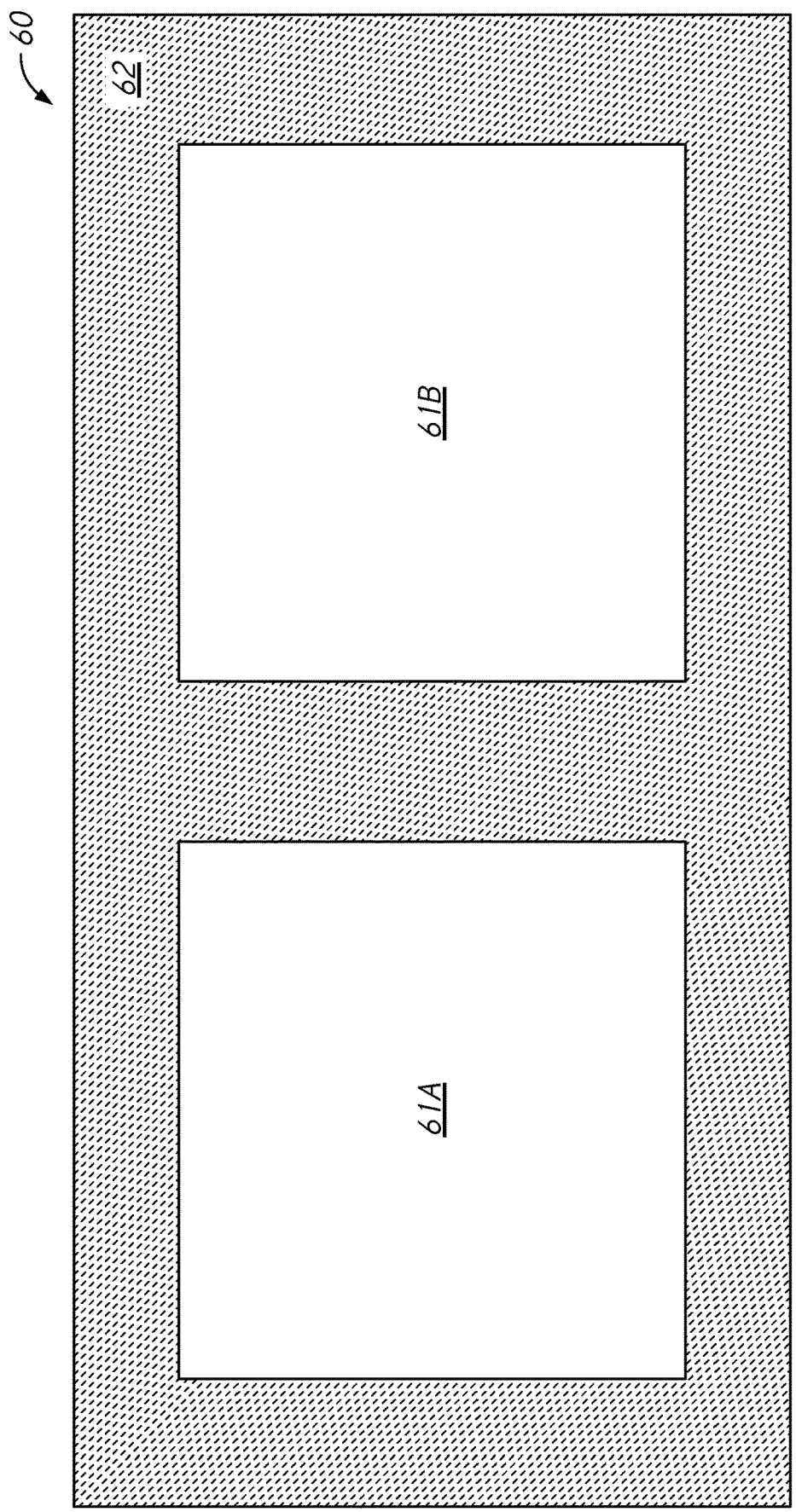
FIG. 6 is a schematic diagram of test structures in a semiconductor device in accordance with an embodiment of the present disclosure.

FIG. 6 is a schematic diagram of test structures 61A and 61B in a test portion 60 of a semiconductor device in accordance with an embodiment of the present disclosure. In some embodiments, the test portion 60 may be in the memory device 500 of FIG. 5. The test portion 60 includes a plurality of test structures, including the test structures 61A and 61B. In this example, two test structures 61A and 61B are illustrated; however a number of the plurality of test structures is not be limited to two. The test portion 60 may be formed anywhere in the semiconductor device. The test portion 60 may be disposed any space in each die, such as any corner of each die. Alternatively, the test portion 60 may be disposed in a scribe region between adjacent dies. The test portion 60 may be disposed in a manner that positioning of the test portion 60 does not affect physical/electrical characteristics of the die.

The test structures 61A and 61B may be formed simultaneously using the dual-Damascene process. The test portion 60 includes a dielectric layer 62 in a BEOL, such as any of the dielectric layer 531 in the portion 522 of FIG. 5. The dielectric layer 62 includes one or more insulating materials. For example, the one or more insulating materials may include silicon dioxide (SiO2) or silicon oxycarbide (SiOC). In some embodiments, the test portion 60 may be formed on a dielectric base layer, such as the dielectric base layer 11 of FIGS. 1-4 or above the dielectric layers 512 and 518. The test structures 61A and 61B are disposed in and on the dielectric layer 62. The test structures 61A and 61B include conductive components, such as wirings and contacts coupled to the wirings. The conductive components may include, for example, copper (Cu).

The test structures 61A and 61B include different patterns of wirings and contacts, including different pattern parameters. The different pattern parameters include a first distance between first and second conductive components in the test structure 61A and a second distance between third and fourth conductive components corresponding to the first and second conductive component in the test structure 61B. For example, the first and second distances may be different space widths between adjacent wirings, different space widths between adjacent contacts, and different space widths between a side of a wiring and a contact adjacent to the side of the wiring. The test portion 60 may be used to compare effects of resist poisoning on the patterns in the test structures 61A and 61B. Based on the results of using the different test structures, a suitable structure for wirings and contacts formed by a dual-Damascene process may be determined.

FIG. 7A is a schematic diagram for a test layout of a structure 70 in a semiconductor device in accordance with an embodiment of the present disclosure. FIG. 7A may be a top view showing the test layout of the structure 70 including a line A-A' extending in a direction 712 and a line B-B' extending in a direction 711. The directions 711 and 712 are different from each other. In some embodiments, the direction 712 may be perpendicular to the direction 711.

FIGS. 7B and 7C are vertical cross-sectional views of the structure 70 in the semiconductor device in accordance with the embodiment of the present disclosure. FIG. 7B is a cross-sectional view showing the structure 70 along the line A-A' shown in FIG. 7A. FIG. 7C is a cross-sectional view showing the structure 70 along the line B-B' shown in FIG. 7A.

In some embodiments, the structure 70 may be included in the portion 522 fabricated in a back-end-of-line (BEOL) of FIG. 5. The structure 70 may be formed using the dual-Damascene process. The structure 70 may be included in a memory array region 504 and/or a peripheral region 514 of the memory device 500. In some embodiments, the structure 70 may be included in the test structures 61A and/or 61B of FIG. 6. The structure 70 may be used to describe pattern parameters of test structures, such as the test structures 61A and 61B.

The structure 70 includes a dielectric layer 72, wirings 73A and 73B, and contacts 74 coupled to either one of the wirings 73A and 73B. Each of the wirings 73A and 73B is a conductive component. Each of the wirings 73A and 73B has a length X in the direction 711 and a width Y in the direction 712. The wirings 73A and 73B are disposed adjacent to one another in the direction 712, with a distance Z between the adjacent wirings 73A and 73B. The distance Z is an example of a distance between two conductive components, for example, between two adjacent wirings 73A and 73B. The distance Z between the adjacent wirings 73A and 73B is a distance between two adjacent wirings 73A and 73B and may represent a width of a space between the adjacent wirings 73A and 73B.

Some of the contacts 74 may be disposed under the wiring 73A and coupled to the wiring 73A. Some of the contacts 74 may be disposed under the wiring 73B and coupled to the wiring 73B. In some embodiments, the contacts 74 may be in a pillar shape. Each of the contacts 74 is a conductive component. Each of the contacts 74 may have a cross section having a length CHX in the direction 711 and a width CHY in the direction 712. The contacts 74 may include adjacent contacts 74 in the direction 711 with a distance CHS1 between the adjacent contacts 74. The distance CHS1 between the adjacent contacts 74 may represent a width of a space between the adjacent contacts 74. The contacts 74 may include adjacent contacts 74 in the direction 712 with a distance CHS2 between the adjacent contacts 74. The distance CHS1 is another example of a distance between two conductive components, for example, between adjacent contacts 74. Similarly, the distance CHS2 is another example of a distance between two conductive components, for example, between adjacent contacts 74.

The contacts 74 may include some contacts 74 adjacent to a side 75 of each of wirings 73A and 73B with a distance Y0 from the side 75. The distance Y0 between some contacts 74 and the side 75 may represent a width of a space between the contacts 74 and the side 75. The distance Y0 is another example of a distance between two conductive components.

For example, the distance Y0 may be a distance between the side 75 and a side surface of the contact 74 adjacent to the side 75.

As previously described, the test structures 61A and 61B in FIG. 6 have different pattern parameters. The different pattern parameters may include different distances Z (space widths) between the adjacent wirings 73A and 73B, different distances Y0 (space widths) between the side 75 and contacts 74 adjacent to the side 75, different distances CHS1 (space widths) between the contacts 74 adjacent in the direction 711, and/or different distances CHS2 (space widths) between the contacts 74 adjacent in the direction 712.

Examples of variations of the structure 70 for the test structures 61A and 61B will be described with reference to FIG. 8A to FIG. 10C. In the examples of FIG. 8A to FIG. 10C, a length X and a width Y of wirings and a length CHX and a width CHY of contacts may be constant.

Figure 8A:
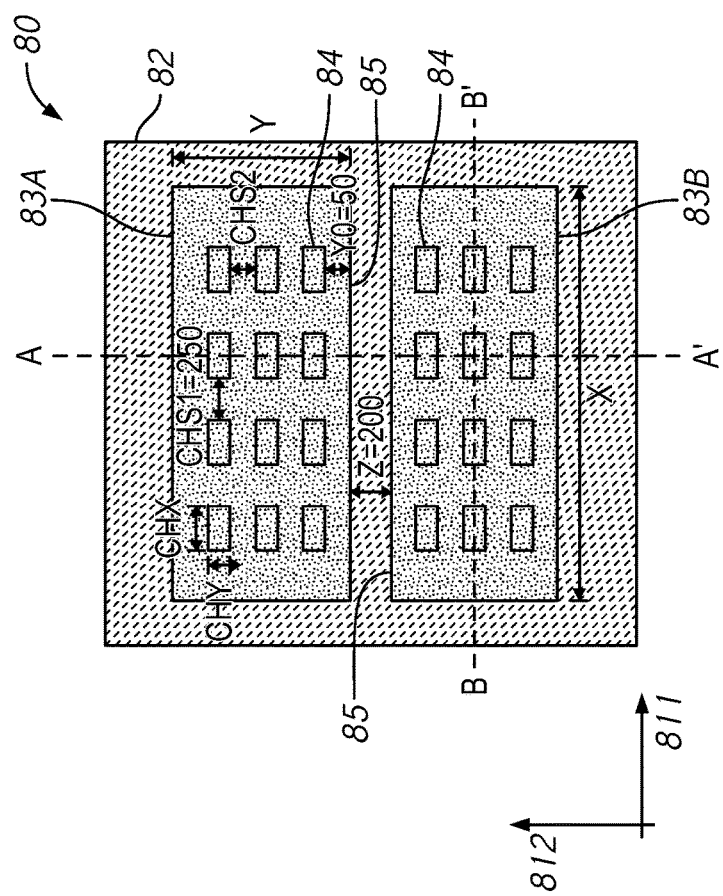
FIG. 8A is a schematic diagram for a test structure of a structure in a semiconductor device in accordance with an embodiment of the present disclosure.

FIG. 8A is a schematic diagram for a test layout of a structure 80 in a semiconductor device in accordance with an embodiment of the present disclosure. FIG. 8A may be a top view showing the test layout of the structure 80 including a line A-A' extending in a direction 812 and a line B-B' extending in a direction 811. The directions 811 and 812 are different from each other. In some embodiments, the direction 812 may be perpendicular to the direction 811.

Figure 8C:
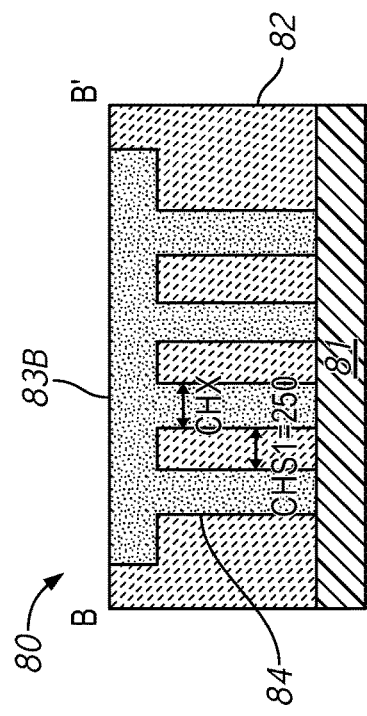
FIGS. 8B and 8C are vertical cross-sectional views of the structure of FIG. 8A in the semiconductor device in accordance with the embodiment of the present disclosure.
Figure 8B:
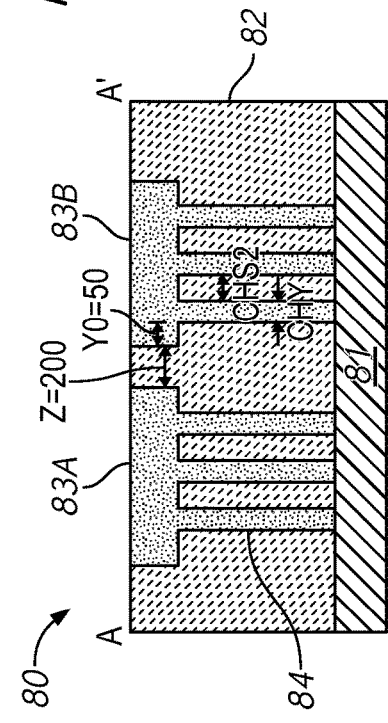

FIGS. 8B and 8C are vertical cross-sectional views of the structure 80 in the semiconductor device in accordance with the embodiment of the present disclosure. FIG. 8B is a cross-sectional view showing the structure 80 along the line A-A' shown in FIG. 8A. FIG. 8C is a cross-sectional view showing the structure 80 along the line B-B' shown in FIG. 8A. In some embodiments, the structure 80 may be used for any of the test structures 61A and 61B, but not both.

The structure 80 includes a dielectric layer 82, wirings 83A and 83B, and contacts 84 coupled to either one of the wirings 83A and 83B. Each of the wirings 83A and 83B and the contacts 84 is a conductive component. Each of the wirings 83A and 83B has a length X in the direction 811 and a width Y in the direction 812. The wirings 83A and 83B are disposed adjacent to one another in the direction 812, with a distance Z that is 200 nm between the adjacent wirings 83A and 83B. The distance Z is an example of a distance between two conductive components, for example, between two adjacent wirings 83A and 83B.

Some of the contacts 84 may be disposed under the wiring 83A and coupled to the wiring 83A. Some of the contacts 84 may be disposed under the wiring 83B and coupled to the wiring 83B. In some embodiments, the contacts 84 may be in a pillar shape. Each of the contacts 84 may have a cross section having a length CHX in the direction 811 and a width CHY in the direction 812. The contacts 84 may include adjacent contacts 84 in the direction 811 with a distance CHS1 that is 250 nm between the adjacent contacts 84. The contacts 84 may include adjacent contacts 84 in the direction 812 with a distance CHS2 between the adjacent contacts 84. The distance CHS1 is another example of a distance between two conductive components, for example, between adjacent contacts 84. Similarly, the distance CHS2 is another example of a distance between two conductive components, for example, between adjacent contacts 84.

The contacts 84 may include some contacts 84 adjacent to a side 85 of each of wirings 83A and 83B with a distance Y0 that is 50 nm from the side 85. The distance Y0 is another example of a distance between two conductive components.

For example, the distance Y0 may be a distance between the side 85 and a side surface of the contact 84 adjacent to the side 85.

Figure 9A:
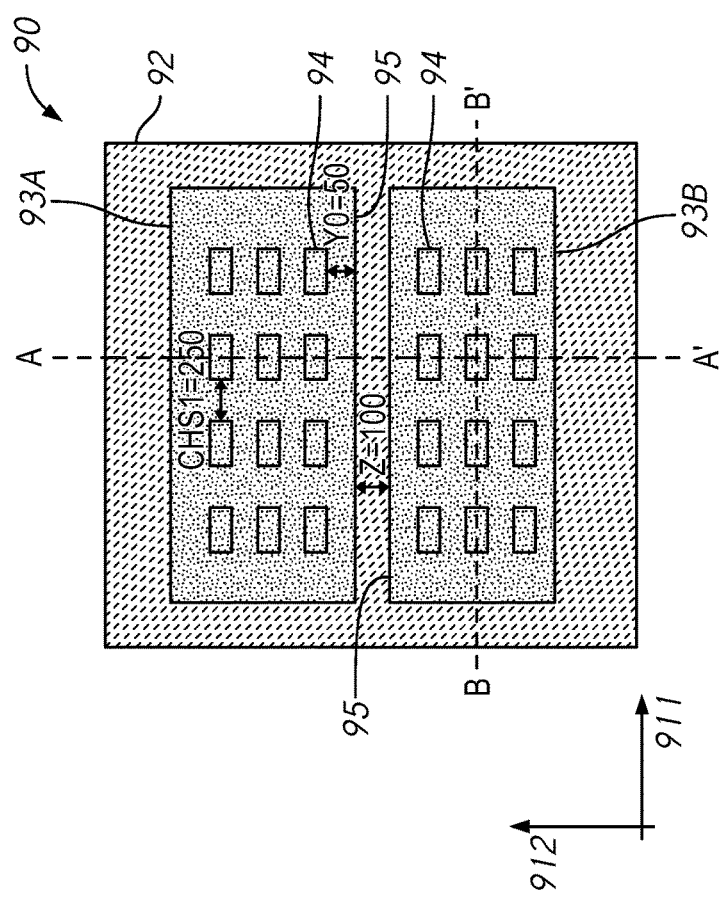
FIG. 9A is a schematic diagram for a test structure of a structure in a semiconductor device in accordance with an embodiment of the present disclosure.

FIG. 9A is a schematic diagram for a test layout of a structure 90 in a semiconductor device in accordance with an embodiment of the present disclosure. FIG. 9A may be a top view showing the test layout of the structure 90 including a line A-A' extending in a direction 912 and a line B-B' extending in a direction 911. The directions 911 and 912 are different from each other. In some embodiments, the direction 912 may be perpendicular to the direction 911.

Figure 9C:
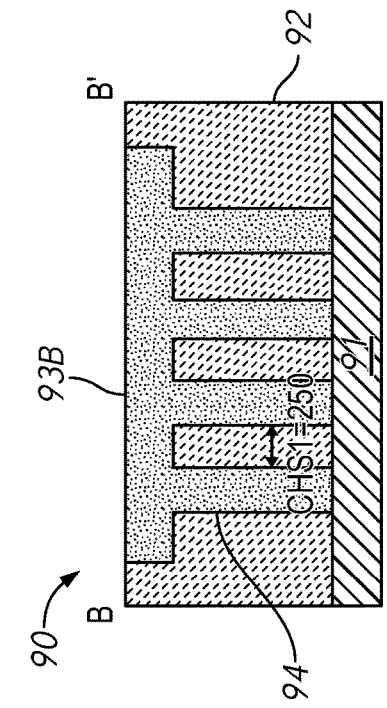
FIGS. 9B and 9C are vertical cross-sectional views of the structure of FIG. 9A in the semiconductor device in accordance with the embodiment of the present disclosure.
Figure 9B:
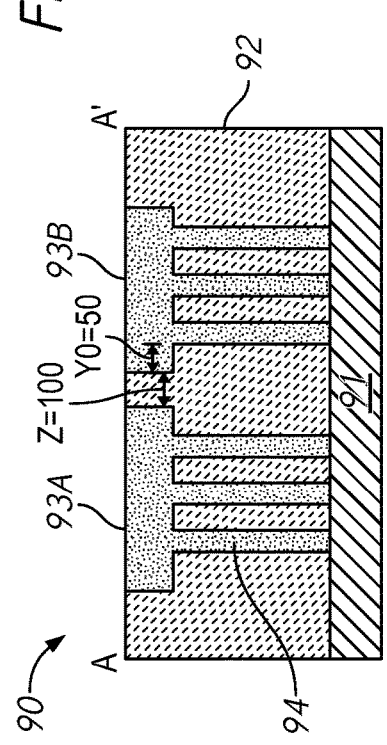

FIGS. 9B and 9C are vertical cross-sectional views of the structure 90 in the semiconductor device in accordance with the embodiment of the present disclosure. FIG. 9B is a cross-sectional view showing the structure 90 along the line A-A' shown in FIG. 9A. FIG. 9C is a cross-sectional view showing the structure 90 along the line B-B' shown in FIG. 9A. In some embodiments, the structure 90 may be used for any of the test structures 61A and 61B, but not both.

The structure 90 includes a dielectric layer 92, wirings 93A and 93B, and contacts 94 coupled to either one of the wirings 93A and 93B. Each of the wirings 93A and 93B and the contacts 94 is a conductive component. The wirings 93A and 93B, and the contacts 94 in FIGS. 9A-9C correspond to the wirings 83A and 83B, and the contacts 84 in FIGS. 8A-8C, respectively. Each of the wirings 93A and 93B has a length X in the direction 911 and a width Y in the direction 912. The wirings 93A and 93B are disposed adjacent to one another in the direction 912, with a distance Z that is 100 nm, shorter than the distance Z of FIGS. 8A-8B, between the adjacent wirings 93A and 93B. The distance Z is an example of a distance between two conductive components, for example, between two adjacent wirings 93A and 93B.

Some of the contacts 94 may be disposed under the wiring 93A and coupled to the wiring 93A. Some of the contacts 94 may be disposed under the wiring 93B and coupled to the wiring 93B. In some embodiments, the contacts 94 may be in a pillar shape. Each of the contacts 94 may have a cross section having a length CHX in the direction 911 and a width CHY in the direction 912. The contacts 94 may include adjacent contacts 94 in the direction 911 with a distance CHS1 that is 250 nm between the adjacent contacts 94. The contacts 94 may include adjacent contacts 94 in the direction 912 with a distance CHS2 between the adjacent contacts 94. The distance CHS1 is another example of a distance between two conductive components, for example, between adjacent contacts 94. Similarly, the distance CHS2 is another example of a distance between two conductive components, for example, between adjacent contacts 94. The distance CHS1 is another example of a distance between two conductive components, for example, between adjacent contacts 94. Similarly, the distance CHS2 is another example of a distance between two conductive components, for example, between adjacent contacts 94.

The contacts 94 may include some contacts 94 adjacent to a side 95 of each of wirings 93A and 93B with a distance Y0 that is 50 nm from the side 95. The distance Y0 is another example of a distance between two conductive components. For example, the distance Y0 may be a distance between the side 95 and a side surface of the contact 94 adjacent to the side 95.

FIG. 10A is a schematic diagram for a test layout of a structure 100 in a semiconductor device in accordance with an embodiment of the present disclosure. FIG. 10A may be a top view showing the test layout of the structure 100 including a line A-A' extending in a direction 1012 and a line B-B' extending in a direction 1011. The directions 1011 and 1012 are different from each other. In some embodiments, the direction 1012 may be perpendicular to the direction 1011.

FIGS. 10B and 10C are vertical cross-sectional views of the structure 100 in the semiconductor device in accordance with the embodiment of the present disclosure. FIG. 10B is a cross-sectional view showing the structure 100 along the line A-A' shown in FIG. 10A. FIG. 10C is a cross-sectional view showing the structure 100 along the line B-B' shown in FIG. 10A. In some embodiments, the structure 100 may be used for any of the test structures 61A and 61B, but not both.

The structure 100 includes a dielectric layer 102, wirings 103A and 103B, and contacts 104 coupled to either one of the wirings 103A and 103B. Each of the wirings 103A and 103B, and the contacts 104 is a conductive component. The wirings 103A and 103B, and the contacts 104 in FIGS. 10A-10C correspond to the wirings 83A and 83B, and the contacts 84 in FIGS. 8A-8C, respectively. The wirings 103A and 103B, and the contacts 104 in FIGS. 10A-10C also correspond to the wirings 93A and 93B, and the contacts 94 in FIGS. 9A-9C, respectively. Each of the wirings 103A and 103B has a length X in the direction 1011 and a width Y in the direction 1012. The wirings 103A and 103B are disposed adjacent to one another in the direction 1012, with a distance Z that is 100 nm, shorter than the distance Z of FIGS. 8A-8B, between the adjacent wirings 103A and 103B. The distance Z is an example of a distance between two conductive components, for example, between two adjacent wirings 103A and 103B.

Some of the contacts 104 may be disposed under the wiring 103A and coupled to the wiring 103A. Some of the contacts 104 may be disposed under the wiring 103B and coupled to the wiring 103B. In some embodiments, the contacts 104 may be in a pillar shape. Each of the contacts 104 may have a cross section having a length CHX in the direction 1011 and a width CHY in the direction 1012. The contacts 104 may include adjacent contacts 104 in the direction 1011 with a distance CHS1 that is 150 nm, shorter than the distance CHS1 of FIGS. 8A-8B and 9A-9B, between the adjacent contacts 104. The contacts 104 may include adjacent contacts 104 in the direction 1012 with a distance CHS2 between the adjacent contacts 104. The distance CHS1 is another example of a distance between two conductive components, for example, between adjacent contacts 104. Similarly, the distance CHS2 is another example of a distance between two conductive components, for example, between adjacent contacts 104.

The contacts 104 may include some contacts 104 adjacent to a side 105 of each of wirings 103A and 103B with a distance Y0 that is 50 nm from the side 105. The distance Y0 is another example of a distance between two conductive components. For example, the distance Y0 may be a distance between the side 105 and a side surface of the contact 104 adjacent to the side 105.

Because of the shorter distance Z of FIGS. 9A-9B than the distance Z of FIGS. 8A-8B, an effect of resist poisoning on patterning wirings may be more salient in the structure 90 than in the structure 80. Because of the shorter CHS1 in the structure 100, a density of contacts 104 in the direction 1011 becomes higher than a density of contacts 84 or 94 in the direction 811 or 911. The higher density of contacts 104 combined with the shorter distance Z of FIGS. 10A-10B than the distance Z of FIGS. 8A-8B, an effect of resist poisoning on patterning wirings may be even more salient in the structure 100 than in the structure 90.

As shown in comparison between different distances between corresponding conductive components in the structures 80, 90 and 100, the effect of resist poisoning on patterning wirings, whether it is salient or not, may be observed. Such observation may be used for determining suitable distances between the conductive components. Thus, by comparison of test structures including different distances between two corresponding conductive components, appropriate distances between two conductive components may be determined.

Embodiments of a test pattern including a plurality of test structures in the BEOL above the FEOL that include a first test structure and a second test structure including different pattern parameters are described above. The first test structure includes first and second conductive components adjacent to one another. The second test structure includes third and fourth conductive components adjacent to one another, corresponding to the first and second conductive components respectively. The different pattern parameters may be a first distance between the first and second conductive components and a second distance between the third and fourth conductive components that is different from the first distance. For example, the first and second distances may be different space widths between adjacent wirings, different space widths between adjacent contacts, and different space widths between a side of a wiring and a contact adjacent to the side of the wiring. The different pattern parameters may provide a user comparative results showing effects of resist poisoning on the plurality of test structures. Based on the result, the user may be able to verify what pattern parameters may be less affected or not affected by the resist poisoning, and further able to determine appropriate pattern parameters to avoid forming short circuits in the Dual-damascene process due to resist poisoning while forming a portion above the FEOL.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus, comprising:
   a memory cell region and a peripheral region;
   a semiconductor substrate in the memory cell region and the peripheral region;
   a dielectric layer on the semiconductor substrate; and
   a plurality of test structures on the dielectric layer, the plurality of test structures comprising:
      a first test structure including:
         a first conductive component and a second conductive component adjacent to one another, the first conductive component comprising a first wiring, and the second conductive component comprising a first contact coupled to the first wiring; and
      a second test structure including:
         a third conductive component and a fourth conductive component adjacent to one another, the third conductive component comprising a second wiring, and the fourth conductive component comprising a second contact coupled to the second wiring, wherein
      a first distance between the first conductive component and the second conductive component is different from a second distance between the third conductive component and the fourth conductive component, and
      the first distance is a distance between a side of the first wiring and a side surface of the first contact adjacent to the side of the first wiring, and the second distance is a distance between a side of the second wiring and a side surface of the second contact adjacent to the side of the second wiring.

2. The apparatus of claim 1, wherein
   the first test structure and the second test structure further comprise a third wiring and a fourth wiring, respectively, and
   a third distance between the first wiring of the first test structure and the second wiring of the second test structure is different from a fourth distance between the third wiring of the first test structure and the fourth wiring of the second test structure.

3. The apparatus of claim 1, wherein
   the first test structure further comprises a third contact coupled to the first wiring, the third contact adjacent to the first contact in a first direction,
   the second test structure further comprises a fourth contact coupled to the second wiring, the fourth contact adjacent to the second contact in the first direction, and
   a third distance between the third contact and the first contact in the first test structure in the first direction is different from a fourth distance between the fourth contact and the second contact in the second test structure in the first direction.

4. The apparatus of claim 3, wherein
   the first test structure further comprises a fifth contact coupled to the first wiring, the fifth contact adjacent to at least one of the first contact or the third contact in a second direction different from the first direction,
   the second test structure further comprises a sixth contact coupled to the second wiring, the six contact adjacent to at least one of the second contact or the fourth contact in the second direction, and
   a fifth distance between the fifth contact and the at least one of the first contact or the third contact in the first test structure in the second direction is different from a six distance between the sixth contact and the at least one of the second contact or the fourth contact in the second test structure in the second direction.

5. The apparatus of claim 1, wherein the dielectric layer is below the first structure and the second structure, and wherein the dielectric layer comprises silicon nitride (Si3N4).

6. The apparatus of claim 5, wherein the dielectric layer is a first dielectric layer,
   wherein the first test structure and the second test structure comprise a second dielectric layer including silicon dioxide (SiO2) or silicon oxycarbide (SiOC).

7. An apparatus, comprising:
a memory cell including a transistor and a capacitor above the transistor;
a first dielectric layer above the capacitor; and
a test pattern including:
- a second dielectric layer above the first dielectric layer;
- a first structure that includes a first interconnect above the first dielectric layer, the first interconnect including:
  - a first conductive component and a second conductive component adjacent to one another, the first conductive component comprising a first wiring, and the second conductive component comprising a first contact below the first wiring and coupled to the first wiring; and
- a second structure that includes a second interconnect above the first dielectric layer, the second interconnect including:
  - a third conductive component and a fourth conductive component adjacent to one another, the third conductive component comprising a second wiring, and the fourth conductive component comprising a second contact below the second wiring and coupled to the second wiring, wherein
a first distance between the first conductive component and the second conductive component is different from a second distance between the third conductive component and the fourth conductive component, and
the first distance is a distance between a side of the first wiring and a side surface of the first contact adjacent to the side of the first wiring, and the second distance is a distance between a side of the second wiring and a side surface of the second contact adjacent to the side of the second wiring.

8. The apparatus of claim 7, wherein the first dielectric layer comprises silicon nitride (Si3N4).

9. The apparatus of claim 8, wherein the second dielectric layer comprises silicon dioxide (SiO2) or silicon oxycarbide (SiOC).

10. The apparatus of claim 7, wherein the test pattern further comprises a third dielectric layer above the first, second, third and fourth conductive components.

11. The apparatus of claim 7, wherein
the first structure and the second structure further comprise a third wiring and a fourth wiring, respectively, and
a third distance between the first wiring of the first structure and the second wiring of the second structure is different from a fourth distance between the third wiring of the first structure and the fourth wiring of the second structure.

12. The apparatus of claim 7, wherein
the first structure further comprises a third contact coupled to the first wiring, the third contact adjacent to the first contact in a first direction,
the second structure further comprises a fourth contact coupled to the second wiring, the fourth contact adjacent to the second contact in the first direction, and
a third distance between the third contact and the first contact in the first structure in the first direction is different from a fourth distance between the fourth contact and the second contact in the second structure in the first direction.

13. The apparatus of claim 12, wherein
the first structure further comprises a fifth contact coupled to the first wiring, the fifth contact adjacent to at least one of the first contact or the third contact in a second direction,
the second structure further comprises a sixth contact coupled to the second wiring, the six contact adjacent to at least one of the second contact of the fourth contact in the second direction, and
a fifth distance between the fifth contact and the at least one of the first contact or the third contact in the first structure in the second direction is different from a six distance between the sixth contact and the at least one of the second contact or the fourth contact in the second structure in the second direction.

* * * * *